(12) United States Patent
Moroz et al.

(10) Patent No.: US 7,926,018 B2
(45) Date of Patent: Apr. 12, 2011

(54) METHOD AND APPARATUS FOR GENERATING A LAYOUT FOR A TRANSISTOR

(75) Inventors: Victor Moroz, Saratoga, CA (US); Xi-Wei Lin, Fremont, CA (US); Mark Rubin, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 399 days.

(21) Appl. No.: 11/860,775

(22) Filed: Sep. 25, 2007

(65) Prior Publication Data

US 2009/0083688 A1    Mar. 26, 2009

(51) Int. Cl.
*G06F 17/50* (2006.01)
*G06F 9/45* (2006.01)

(52) U.S. Cl. ............ 716/132; 716/51; 716/53; 716/55; 716/109; 716/110; 716/112; 716/120; 716/136; 716/139

(58) Field of Classification Search .......... 716/1, 2, 716/4–6, 10, 11, 17, 21; 257/207, 288, 368
See application file for complete search history.

(56) References Cited

U.S. PATENT DOCUMENTS

| | | | | |
|---|---|---|---|---|
| 5,872,724 A * | 2/1999 | Nakada | | 703/15 |
| 6,430,733 B1 * | 8/2002 | Cohn et al. | | 716/11 |
| 6,574,786 B1 * | 6/2003 | Pohlenz et al. | | 716/17 |
| 6,799,310 B2 * | 9/2004 | Miyamoto | | 716/10 |
| 7,039,882 B2 * | 5/2006 | Rana et al. | | 716/103 |
| 7,084,464 B2 * | 8/2006 | Zounes | | 257/368 |
| 7,095,063 B2 * | 8/2006 | Cohn et al. | | 257/207 |
| 7,356,788 B2 * | 4/2008 | Chang et al. | | 716/5 |
| 7,441,211 B1 * | 10/2008 | Gupta et al. | | 716/2 |
| 7,716,612 B1 * | 5/2010 | Gupta et al. | | 716/132 |
| 2001/0028991 A1 * | 10/2001 | Inanami et al. | | 430/296 |
| 2006/0150132 A1 * | 7/2006 | Gupta | | 716/5 |
| 2006/0271902 A1 * | 11/2006 | Yamashita et al. | | 716/17 |
| 2007/0074146 A1 * | 3/2007 | Tanaka et al. | | 716/21 |
| 2007/0099314 A1 * | 5/2007 | Chen et al. | | 438/14 |
| 2007/0106966 A1 * | 5/2007 | Inoue et al. | | 716/4 |
| 2007/0170474 A1 * | 7/2007 | Kawasaki | | 257/288 |
| 2008/0263483 A1 * | 10/2008 | Koike et al. | | 716/5 |
| 2009/0051383 A1 * | 2/2009 | Ruf et al. | | 324/763 |
| 2009/0193378 A1 * | 7/2009 | Adkisson et al. | | 716/10 |
| 2009/0217228 A1 * | 8/2009 | Melzner | | 716/10 |

* cited by examiner

*Primary Examiner* — Helen Rossoshek
(74) *Attorney, Agent, or Firm* — Park, Vaughan, Fleming & Dowler LLP

(57) ABSTRACT

A system that generates a layout for a transistor is presented. During operation, the system receives a transistor library which includes operating characteristics of fabricated transistors correlated to transistor gate shapes. The system also receives one or more desired operating characteristics for the transistor. Next, the system determines a transistor gate shape for the transistor based on the transistor library so that a fabricated transistor with the transistor gate shape substantially achieves the one or more desired operating characteristics. The system then generates the layout for the transistor which includes the transistor gate shape.

19 Claims, 6 Drawing Sheets

METHOD AND APPARATUS FOR GENERATING A LAYOUT FOR A TRANSISTOR

BACKGROUND

1. Field of the Invention

The present invention relates to techniques for generating a layout for a transistor. More specifically, the present invention relates to a method and apparatus for generating a layout for a transistor so that a transistor which is fabricated from the layout achieves one or more desired operating characteristics.

2. Related Art

Nanometer-scale semiconductor fabrication technologies make it possible to fabricate a large number of transistors on an integrated circuit (IC) chip. As a result, the performance and functionality of IC chips has increased while the cost of individual transistors on the IC chips has decreased. However, nanometer-scale semiconductor fabrication technologies present a number of challenges to IC designers.

One problem is that the sizes of device features, which are presently being fabricated on IC chips are smaller than the wavelength of light used to expose the features on the IC chip. As a result, optical effects, such as interference and fringing, can cause the shape of a feature to be different than the intended shape of the feature. For example, FIG. 4 illustrates drawn layouts for transistor gate shapes and resulting fabricated transistor gate shapes. In FIG. 4, transistor gate 401 has a drawn gate length 402 and a drawn gate width 403, and transistor gate 406 has a drawn gate length 407 and a drawn gate width 408. (Note that an active diffusion region is located on either side of transistor gates 401 and 406.) Due to optical effects, a transistor fabricated based on the drawn transistor gate 401 may have a length 404 at the ends of the gate and a length 405 in the center of the gate. Similarly, a transistor fabricated from drawn transistor gate 406 may have a length 409 at the ends of the gate and a length 410 in the center of the gate. As illustrated, these optical effects create more pronounced variations on transistors with smaller feature sizes (e.g., smaller gate widths). For example, in the larger transistor in FIG. 4, lengths 404-405 may be substantially equal to each other and to drawn gate length 402, whereas in the smaller transistor, lengths 409-410 may be substantially different from each other and from drawn gate length 407.

These non-uniform fabricated transistor gate shapes can cause the transistor to exhibit undesirable operating characteristics such as current crowding, excessive leakage currents, and overheating. For example, the $V_{TH}$ versus W and $I_{ON}$ versus W plots in FIG. 4 illustrate exemplary dependencies of the threshold voltage ($V_{TH}$) to channel width (W) and the current ($I_{ON}$) to channel width (W) which can typically result from these optical effects.

One solution to this problem is to use Optical Proximity Correction (OPC) to adjust the drawn transistor gate shape so that a resulting transistor which is fabricated based on the adjusted transistor gate shape produces a substantially rectangular gate shape. Unfortunately, even if the fabricated transistor gate shape is substantially rectangular, transistors with smaller feature sizes tend to have a non-uniform threshold voltage distribution and a non-uniform current density across the transistor channel. As a result, the transistor's operating characteristics can be a non-linear function of channel width W, thereby complicating the task of designing circuits.

Hence, what is needed is a method and an apparatus for generating a layout for a transistor without the problems described above.

SUMMARY

Some embodiments of the present invention provide a system that generates a layout for a transistor. During operation, the system receives a transistor library which includes operating characteristics of fabricated transistors correlated to transistor gate shapes. The system also receives one or more desired operating characteristics for the transistor. Next, the system determines a transistor gate shape for the transistor based on the transistor library so that a fabricated transistor having the transistor gate shape substantially achieves the one or more desired operating characteristics. The system then generates the layout for the transistor which includes the transistor gate shape.

In some embodiments, while generating the layout for the transistor which includes the transistor gate shape, the system selects a library element which includes the transistor gate shape. The system then generates the layout for the transistor based on the library element.

In some embodiments, while selecting the library element which includes the transistor gate shape, the system selects a parameterized library element which includes a transistor gate having a shape that substantially achieves the desired gate shape. The system then scales the parameterized library element so that the transistor gate in the library element has a shape which is substantially equivalent to the determined transistor gate shape.

In some embodiments, while generating the layout for the transistor which includes the transistor gate shape, the system generates the layout of the transistor using a rectangular gate shape which approximates the one or more desired operating characteristics. The system then post-processes the rectangular gate shape during an optical proximity correction process so that a resulting gate shape for the transistor approximates the determined transistor gate shape.

In some embodiments, the one or more desired operating characteristics for the transistor can include one or more of: a drive strength of the transistor; a speed of the transistor; a leakage current of the transistor; a uniform threshold voltage across a channel of the transistor; a uniform current distribution across a channel of the transistor; and any other operating characteristic for a transistor.

In some embodiments, prior to receiving the transistor library, the system generates the transistor library. In doing so, the system generates layouts for transistors with a specified set of transistor gate shapes. The system then fabricates the layouts for the transistors. Next, the system measures the operating characteristics for the fabricated transistors. The system then correlates the measured operating characteristics of the fabricated transistors with the specified set of transistor gate shapes.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Overview

Some embodiments of the present invention generate a transistor gate shape so that a transistor fabricated based on the gate shape achieves one or more desired operating characteristics for the transistor. The generated gate shapes can produce non-rectangular gate shapes when fabricated on an IC chip. Hence, some embodiments of the present invention differ from existing OPC techniques, which attempt to create fabricated gate shapes that are substantially rectangular.

In some embodiments, transistor gate shapes are modified so that the operating characteristics of the transistor are linear functions of the channel width of the transistor. Note that this can be achieved by selecting a transistor gate shape which, when scaled, scales the operating characteristics of the transistor substantially proportionally. Alternatively, this can be achieved by selecting a transistor gate geometry for a given set of transistor feature sizes (e.g., a given W and L).

Some embodiments use measured operating characteristics for fabricated transistors to determine the shape of a transistor gate for a given transistor gate width W, so that threshold voltages and current distributions are substantially uniform across the channel. The shape can be determined from measured threshold voltage, $V_{TH}(W)$, as well as saturation current, $I_{DSAT}(W)$, and data (which can both be a function of the channel width W). In doing so, the transistor drive strength can be made substantially proportional to W, or the transistor can be designed to meet one or more other desired operating characteristics.

Computer System

Figure 1:
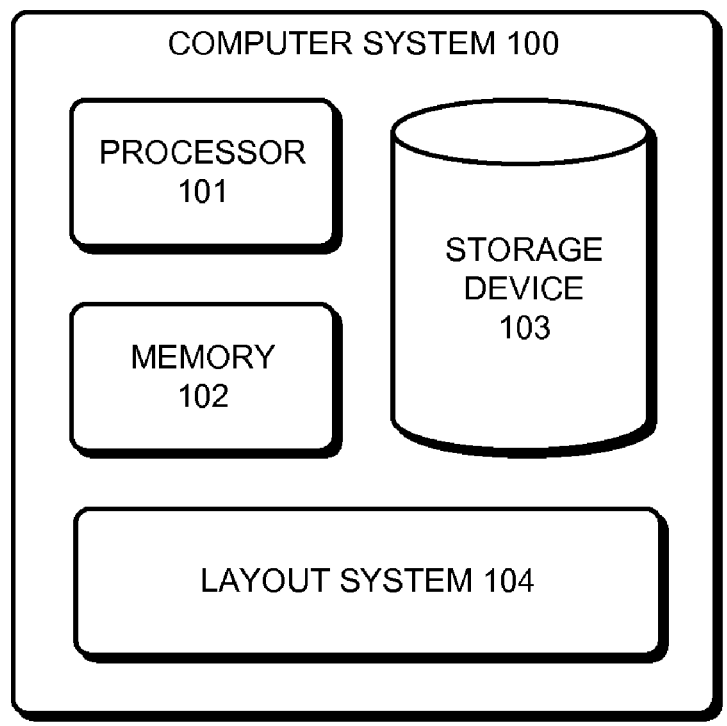
FIG. 1 presents a block diagram of a computer system in accordance with an embodiment of the present invention.

FIG. 1 illustrates a computer system 100 in accordance with an embodiment of the present invention. Computer system 100 includes processor 101, memory 102, storage device 103, and layout system 104.

Processor 101 can generally include any type of processor, including, but not limited to, a microprocessor, a mainframe computer, a digital signal processor, a personal organizer, a device controller, a computational engine within an appliance, and any other processor now known or later developed. Furthermore, processor 101 can include one or more cores.

Note that although FIG. 1 illustrates computer system 100 with one processor, computer system 100 can include more than one processor. In a multi-processor configuration, the processors can be located on a single system board, or multiple system boards.

Memory 102 can include any type of memory, including but not limited to, dynamic random access memory (DRAM), static random access memory (SRAM), flash memory, read only memory (ROM), and any other type of memory now known or later developed.

Storage device 103 can include any type of storage device that can be coupled to a computer system. This includes, but is not limited to, magnetic, optical, magneto-optical storage devices, storage devices based on flash memory and/or battery-backed up memory, and any other storage device now known or later developed.

Figure 2:
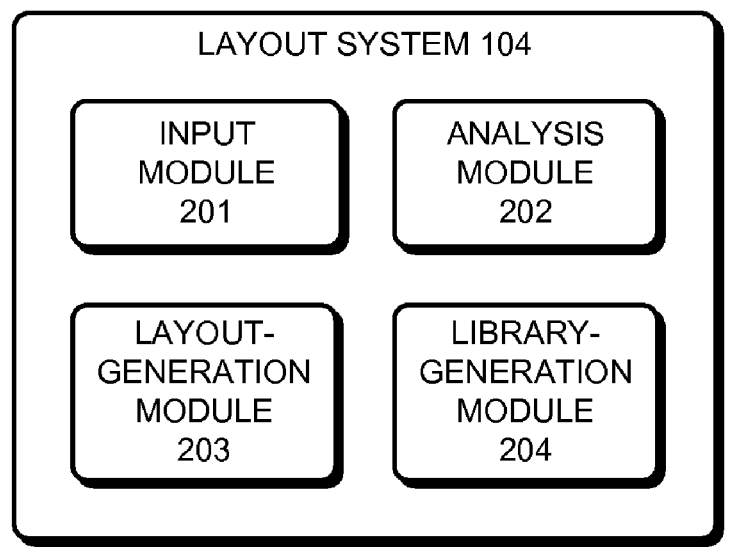
FIG. 2 presents a block diagram of a layout system in accordance with an embodiment of the present invention.

FIG. 2 presents a block diagram of layout system 104 in accordance with an embodiment of the present invention. Layout system 104 includes input module 201; analysis module 202; layout-generation module 203; and library-generation module 204. Input module 201 is configured to receive a transistor library which includes operating characteristics of fabricated transistors correlated to transistor gate shapes and is configured to receive one or more desired operating characteristics for the transistor. Analysis module 202 is configured to determine a transistor gate shape for the transistor based on the transistor library so that a fabricated transistor with the transistor gate shape substantially achieves the one or more desired operating characteristics. Layout-generation module 203 is configured to generate the layout for the transistor which includes the transistor gate shape. Library-generation module 204 is configured to generate a transistor library.

Flow Summary and Context

Figure 3:
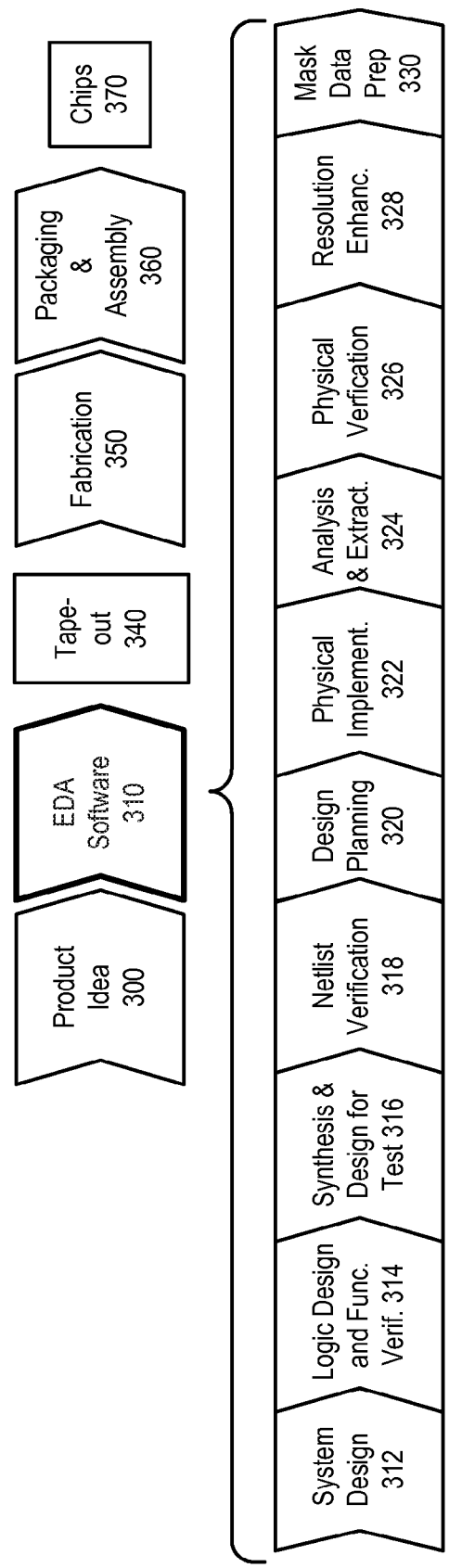
FIG. 3 presents a simplified representation of an exemplary digital ASIC design flow.
Figure 4:
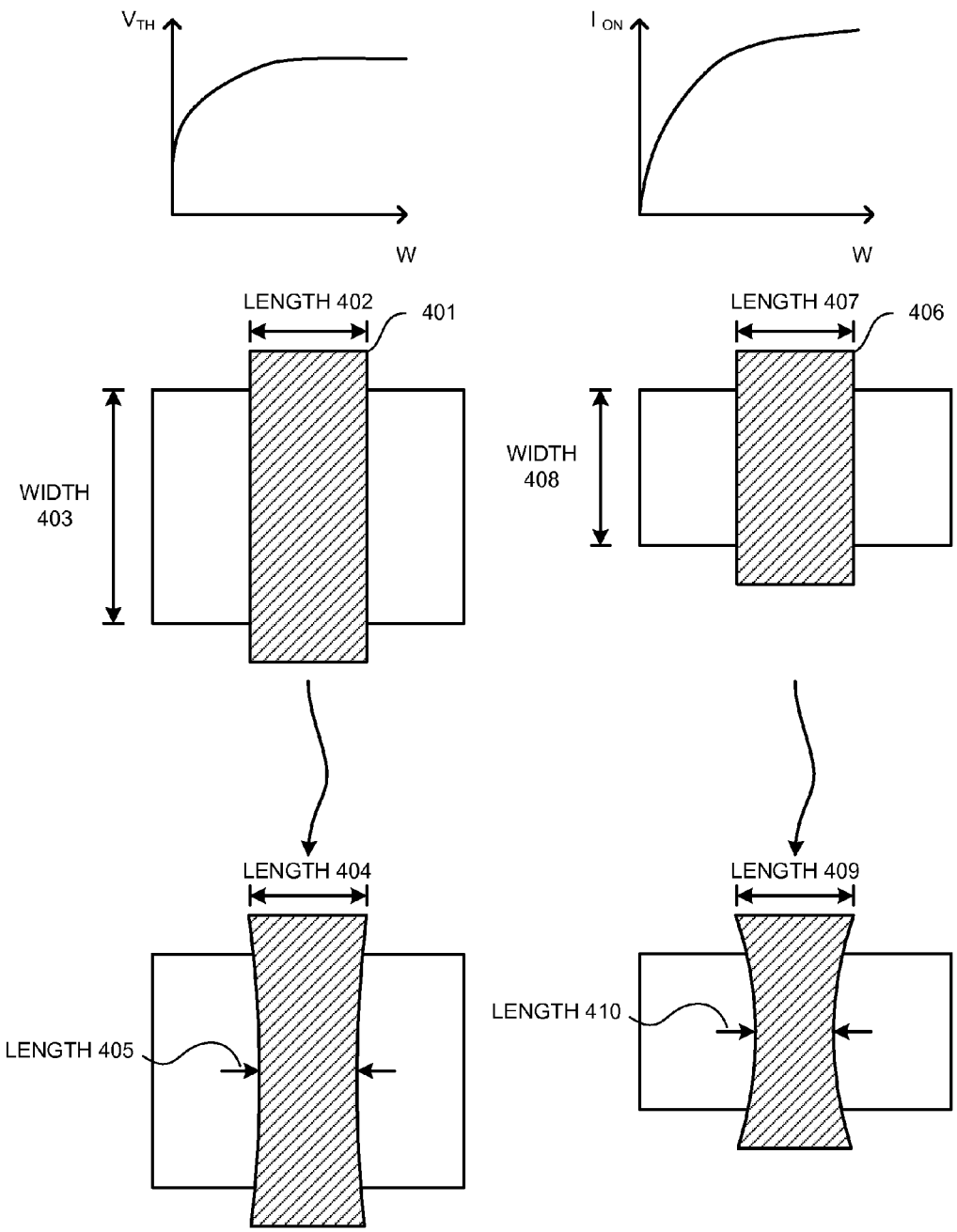
FIG. 4 illustrates drawn transistors and associated fabricated transistors.

Before proceeding further with the description, it may be helpful to place this process in context. FIG. 3 presents a simplified representation of an exemplary digital ASIC design flow. At a high level, the process starts with the product idea (step 300) and is realized in an EDA software design process (step 310). When the design is finalized, it can be taped-out (event 340). After tape out, the fabrication process (step 350) and packaging and assembly processes (step 360) occur resulting, ultimately, in finished chips (result 370).

The EDA software design process (step 310) is actually composed of a number of steps 312-330, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 310) will now be provided.

System design (step 312): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare® products. Note that Saber is a registered trademark of SabreMark Limited Partnership.

Logic design and functional verification (step 314): At this stage, the VHDL, Verilog, or SystemVerilog code for modules in the system is written and the design is checked for functional accuracy. More specifically, does the design as checked to ensure that produces the correct outputs. Exemplary EDA software products from Synopsys, Inc. that can be used at this step include VCS®, VERA®, DesignWare®, Magellan™, Formality®, ESP and LEDA® products.

Synthesis and design for test (step 316): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compile®, Physical Compiler®, Test Compiler, Power Compiler™, FPGA Compiler, Tetramax®, and DesignWare® products.

Netlist verification (step 318): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 320): Here, an overall floorplan for the chip is constructed and analyzed for timing and top-level routing. Exemplary EDA software products from Synopsys, Inc. that can be used at this step include Astro™ and IC Compiler products.

Physical implementation (step 322): The placement (positioning of circuit elements) and routing (connection of the same) occurs at this step. Exemplary EDA software products from Synopsys, Inc. that can be used at this step include the Astro and IC Compiler products. Note that some embodiments of the present invention are directed to generating a layout for transistors so that fabricated transistors achieve one or more desired operating characteristics.

Analysis and extraction (step 324): At this step, the circuit function is verified at a transistor level, this in turn permits what-if refinement. Exemplary EDA software products from Synopsys, Inc. that can be used at this step include Astro-Rail™, PrimeRail, PrimeTime®, and Star RCXT™ products.

Physical verification (step 326): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 328): This step involves geometric manipulations of the layout to improve manufacturability of the design. Exemplary EDA software products from Synopsys, Inc. that can be used at this step include Proteus, ProteusAF, and PSMGen products. Note that some embodiments of the present invention are directed to manipulating the layout so that fabricated transistors achieve one or more desired operating characteristics.

Mask data preparation (step 330): This step provides the "tape-out" data for production of masks for lithographic use to produce finished chips. Exemplary EDA software products from Synopsys, Inc. that can be used at this step include the CATS® family of products.

Note that VCS, VERA, DesignWare, Magellan, Formality, LEDA, Design Compiler, Physical Compiler, Power Compiler, Tetramax, DesignWare, Astro, Astro-Rail, PrimeTime, Star-RCXT, Hercules, and CATS are trademarks or registered trademarks of Synopsys, Inc. in the United States and other countries.

Generating Transistor Layouts

Figure 5:
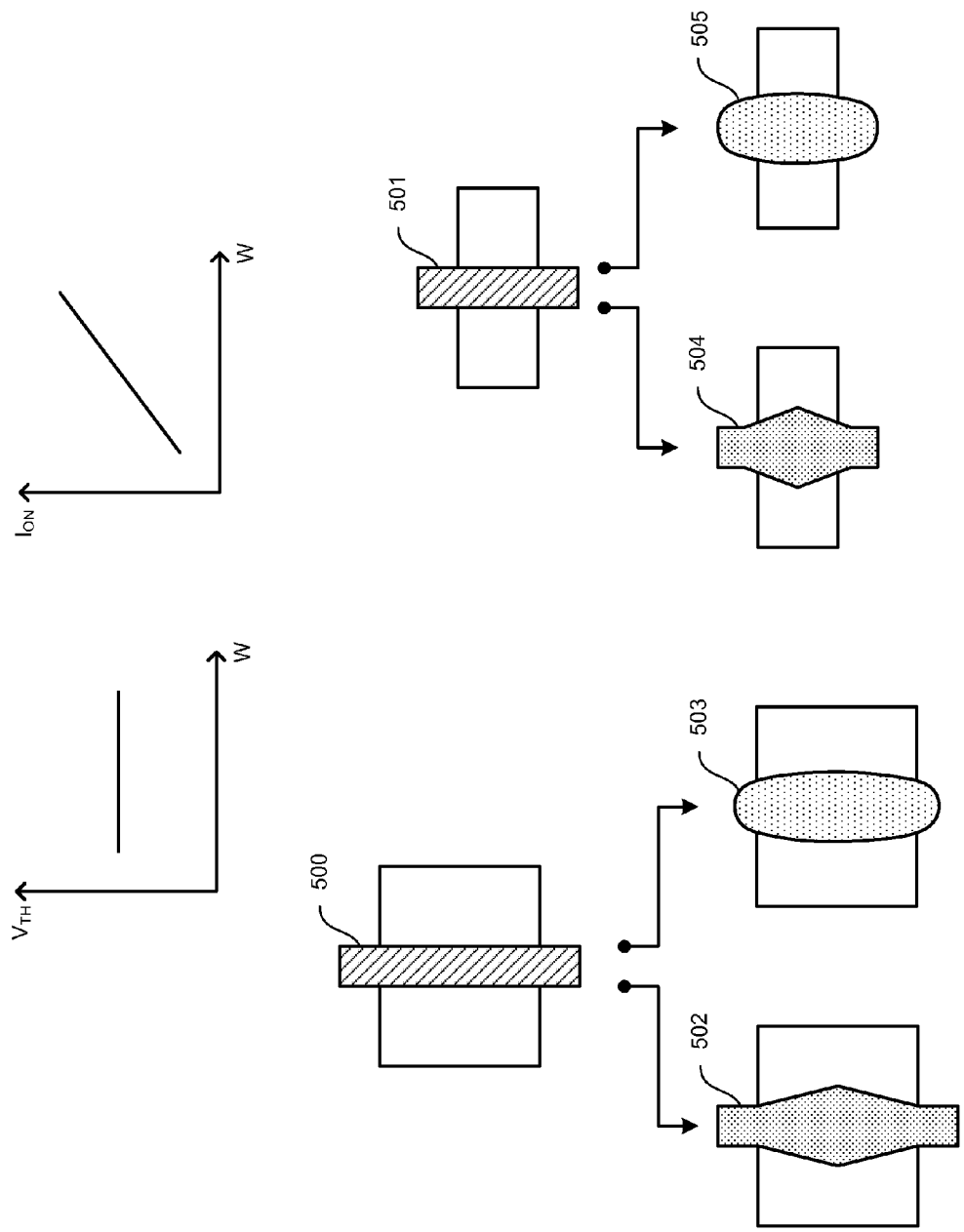
FIG. 5 illustrates drawn transistors in accordance with an embodiment of the present invention.

In some embodiments, a shape of a transistor gate in a layout is generated so that a transistor fabricated from the layout achieves one or more desired operating characteristics. For example, FIG. 5 illustrates a number of drawn transistors in a layout in accordance with an embodiment of the present invention. In some embodiments, a transistor gate shape is generated so that the operating characteristics of a transistor fabricated based on the transistor gate shape achieves a substantially uniform threshold voltage as a function of the transistor gate width (see plot of $V_{TH}$ versus W). Maintaining a substantially uniform threshold voltage across possible transistor gate widths simplifies the circuit design process because the drive strength of the transistor is substantially proportional to transistor gate width (see plot of $I_{ON}$ versus W).

In some embodiments, a baseline transistor which has a specified gate length and specified gate width (e.g., the drawn transistors gate shapes 500-501) is selected. Then, during an OPC process, the drawn transistor gate shapes 500-501 are adjusted so that transistors fabricated based on the adjusted transistor gate shapes achieve one or more desired operating characteristics. In some embodiments, the adjusted transistor gate shape is determined so that if the adjusted transistor gate shape is scaled, the desired operating characteristics are proportionally scaled.

In other embodiments, a transistor gate shape is generated so that if the width and length of the gate (e.g., the drive strength) is scaled, a new transistor gate shape is generated to achieve a desired operating characteristic.

Note that the generated or adjusted transistor gate shapes may depend on the fabrication technology. For example, adjusting drawn transistor gate shape 500 may result in adjusted transistor gate shapes 502 or 503 depending on the fabrication technology. Similarly, adjusting drawn transistor gate shape 501 may result in adjusted transistor gate shapes 504 or 505 depending on the fabrication technology.

In some embodiments, instead of adjusting the gate shape in a layout of a baseline transistor to achieve the one or more desired operating characteristics, the layout of a transistor is generated from scratch, either automatically through a physical implementation design automation tool, or manually by an IC designer.

After the gate shape for the transistor has been generated, the layout can be fabricated. During the fabrication process, optical effects may cause the generated gate shape for the transistor to be different from the fabricated gate shape. However, since these optical effects have been accounted for when generating the gate shape for the transistor, the fabricated gate shape substantially achieves the one or more desired operating characteristics.

Figure 6:
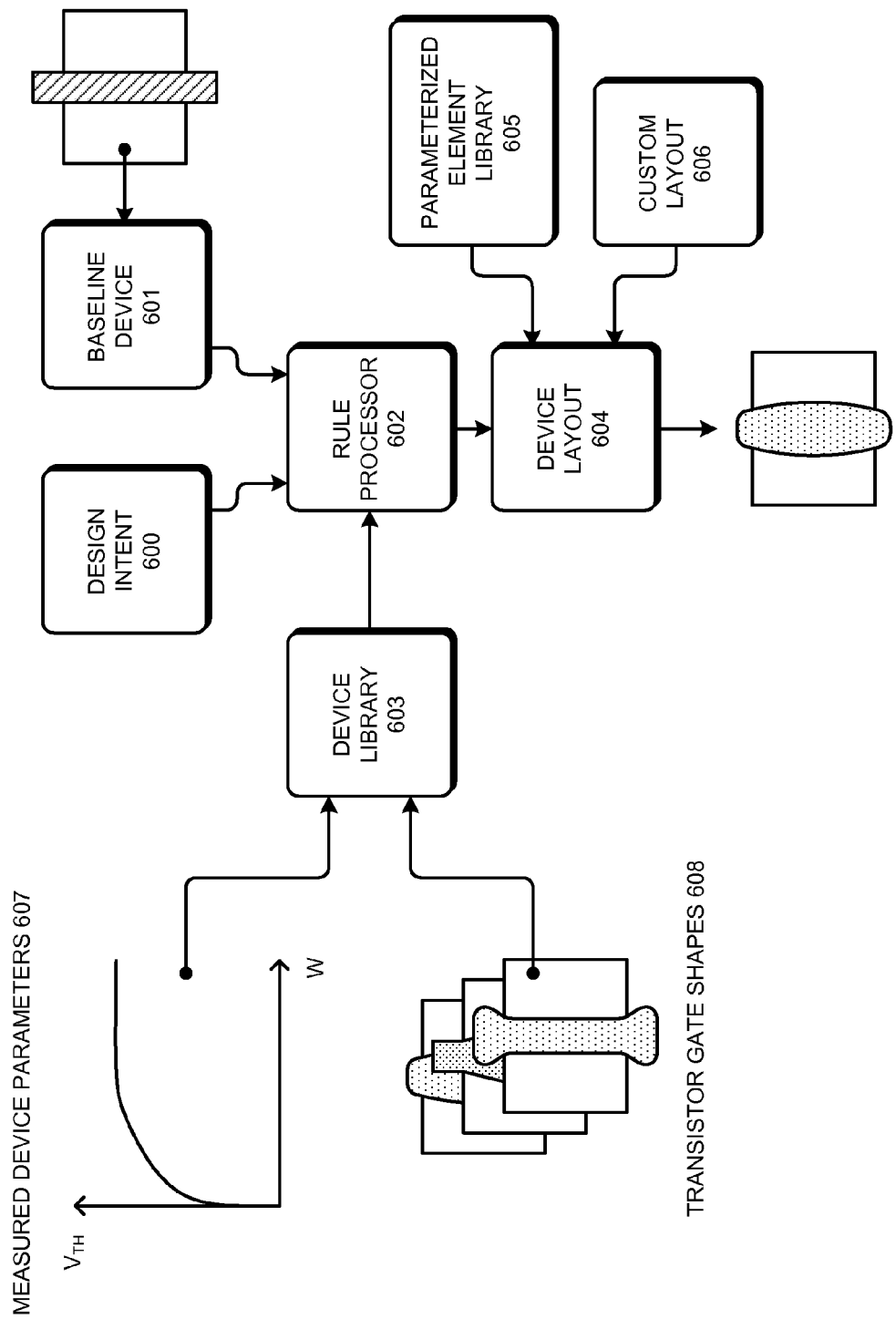
FIG. 6 illustrates the inputs and outputs to a layout system in accordance with an embodiment of the present invention.

FIG. 6 illustrates inputs and outputs to a layout system in accordance with an embodiment of the present invention. Within FIG. 6, rules processor 602 receives design intent 600, baseline device 601, and device library 603.

In some embodiments, design intent 600 includes one or more desired operating characteristics for a transistor, which can include, but are not limited to: a drive strength of the transistor; a speed of the transistor; a leakage current of the transistor; a uniform threshold voltage across a channel of the transistor; a uniform current distribution across a channel of the transistor; a reduction of heat generation by the transistor; and any other operating characteristic for a transistor.

In some embodiments, baseline device 601 can be a transistor with a specified gate length and a specified gate width which is determined based on a transistor library which may or may not account for optical lithographic effects. In other embodiments, baseline device 601 can be a transistor with a specified gate length and a specified gate width which is determined based on design rules tailored for calculations of the gate shape which are derived from a transistor library. In these embodiments, baseline device 601 may or may not substantially achieve the one or more desired operating characteristics for the transistor.

In some embodiments, device library 603 can include measured device parameters 607 which are correlated to transistor gate shapes 608. The process of generating device library 603 is described in more detail with reference to FIG. 8 below.

In some embodiments, rules processor 602 uses one or more of design intent 600, baseline device 601, and device library 603 to generate a device layout 604 for a transistor which achieves the one or more desired operating characteristics specified in design intent 600. In some embodiments, device layout 604 is generated from a parameterized element within parameterized element library 605. In other embodiments, device layout 604 is a custom layout 606 generated by an IC designer.

Figure 7:
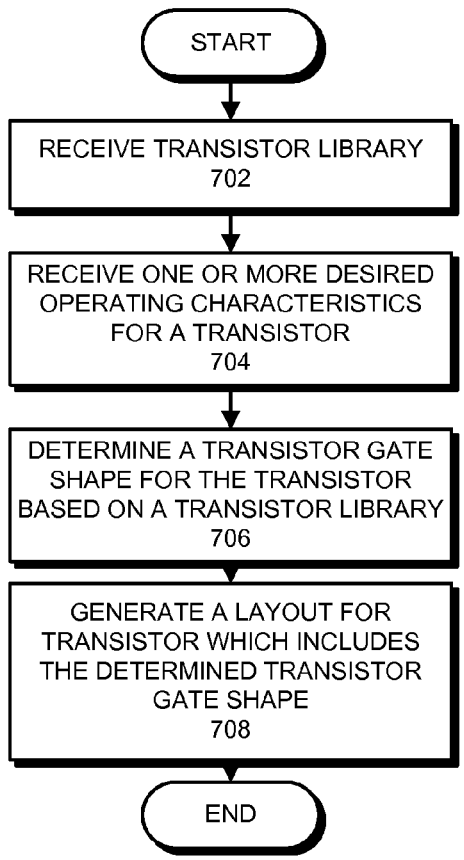
FIG. 7 presents a flow chart illustrating the process of generating a layout for a transistor in accordance with an embodiment of the present invention.

FIG. 7 presents a flow chart illustrating the process of generating a layout for a transistor in accordance with an embodiment of the present invention. The process begins when the system receives a transistor library (step 702) which includes operating characteristics of fabricated transistors correlated to transistor gate shapes. The system then receives one or more desired operating characteristics for the transistor (step 704). Next, the system determines a transistor gate shape for the transistor based on the transistor library (step 706) so that a fabricated transistor with the transistor gate shape substantially achieves the one or more desired operating characteristics. The system then generates the layout for the transistor which includes the transistor gate shape (step 708).

In some embodiments, while generating the layout for the transistor which includes the transistor gate shape, the system selects a library element which includes the transistor gate shape, and generates the layout for the transistor based on the library element. In some embodiments, while selecting the library element which includes the transistor gate shape, the system selects a parameterized library element which includes a transistor gate having a shape that substantially achieves the desired transistor gate shape. The system then scales the parameterized library element so that the transistor gate in the library element has a shape which is substantially equivalent to the transistor gate shape.

In some embodiments, while generating the layout for the transistor which includes the transistor gate shape, the system generates the layout of the transistor using a rectangular gate shape which approximates the one or more desired operating characteristics. For example, the system can automatically generate a rectangular gate shape based on the desired operating characteristics or an IC designer can manually draw a rectangular gate shape. The system then post-processes the rectangular gate shape during an optical proximity correction process so that the gate shape for the transistor approximates the determined transistor gate shape.

Figure 8:
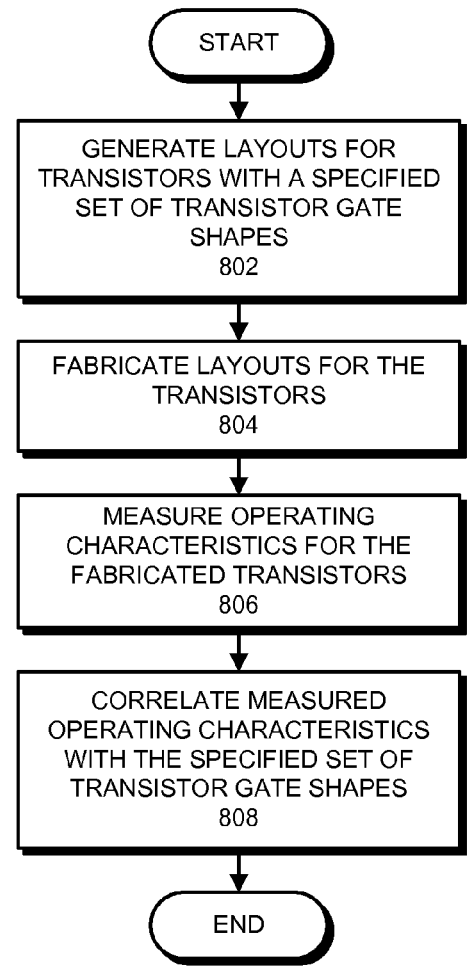
FIG. 8 presents a flow chart illustrating the process of generating a transistor library in accordance with an embodiment of the present invention.

FIG. 8 presents a flow chart illustrating the process of generating a transistor library in accordance with an embodiment of the present invention. The process begins when the system generates layouts for transistors with a specified set of transistor gate shapes (step 802). The system then fabricates the layouts for the transistors (step 804). Next, the system measures the operating characteristics for the fabricated transistors (step 806). The system then correlates the measured operating characteristics of the fabricated transistors with the specified set of transistor gate shapes (step 808).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for generating a physical layout for a transistor, comprising:
   determining a transistor gate shape for the transistor based on a transistor library so that a fabricated transistor with the transistor gate shape substantially achieves one or more desired operating characteristics, wherein the transistor library includes a correlation between operating characteristics of fabricated transistors and transistor gate shapes; and
   generating, by computer, the physical layout for the transistor, wherein the physical layout includes the transistor gate shape, and wherein the physical layout is used to fabricate the transistor.

2. The method of claim 1, wherein generating the physical layout for the transistor involves:
   selecting a library element which includes the transistor gate shape; and
   generating the physical layout for the transistor based on the library element.

3. The method of claim 2, wherein selecting the library element which includes the transistor gate shape involves:
   selecting a parameterized library element which includes a transistor gate having a shape that substantially achieves the desired transistor gate shape; and
   scaling the parameterized library element so that the transistor gate in the library element has a shape which is substantially equivalent to the determined transistor gate shape.

4. The method of claim 1, wherein the one or more desired operating characteristics for the transistor include one or more of:
   a drive strength of the transistor;
   a speed of the transistor;
   a leakage current of the transistor;
   a uniform threshold voltage across a channel of the transistor; and
   a uniform current distribution across a channel of the transistor.

5. The method of claim 1, wherein prior to receiving the transistor library, the method further comprises generating the transistor library by:
   generating physical layouts for transistors with a specified set of transistor gate shapes;
   fabricating the physical layouts for the transistors;
   measuring the operating characteristics for the fabricated transistors; and
   correlating the measured operating characteristics of the fabricated transistors with the specified set of transistor gate shapes.

6. The method of claim 1, wherein generating the physical layout for the transistor involves:
   generating a physical layout containing a rectangular gate shape, wherein the rectangular gate shape approximates the one or more desired operating characteristics for the transistor; and
   processing the rectangular gate shape during an optical proximity correction process so that a resulting gate shape approximates the transistor gate shape.

7. A computer-readable storage medium storing instructions that when executed by a computer cause the computer to perform a method for generating a physical layout for a transistor, wherein the method comprises:
   determining a transistor gate shape for the transistor based on a transistor library so that a fabricated transistor with the transistor gate shape substantially achieves one or more desired operating characteristics, wherein the transistor library includes a correlation between operating characteristics of fabricated transistors and transistor gate shapes; and generating the physical layout for the transistor, wherein the physical layout includes the transistor gate shape, and wherein the physical layout is used to fabricate the transistor.

8. The computer-readable storage medium of claim 7, wherein generating the physical layout for the transistor involves:

selecting a library element which includes the transistor gate shape; and generating the physical layout for the transistor based on the library element.

9. The computer-readable storage medium of claim 8, wherein selecting the library element which includes the transistor gate shape involves:

selecting a parameterized library element which includes a transistor gate having a shape that substantially achieves the desired transistor gate shape; and scaling the parameterized library element so that the transistor gate in the library element has a shape which is substantially equivalent to the determined transistor gate shape.

10. The computer-readable storage medium of claim 7, wherein the one or more desired operating characteristics for the transistor include one or more of:

a drive strength of the transistor;
a speed of the transistor;
a leakage current of the transistor;
a uniform threshold voltage across a channel of the transistor; and
a uniform current distribution across a channel of the transistor.

11. The computer-readable storage medium of claim 7, wherein prior to receiving the transistor library, the method further comprises generating the transistor library by:

generating physical layouts for transistors with a specified set of transistor gate shapes;

fabricating the physical layouts for the transistors;

measuring the operating characteristics for the fabricated transistors; and correlating the measured operating characteristics of the fabricated transistors with the specified set of transistor gate shapes.

12. The computer-readable storage medium of claim 7, wherein generating the physical layout for the transistor involves:

generating a physical layout containing a rectangular gate shape, wherein the rectangular gate shape approximates the one or more desired operating characteristics for the transistor; and processing the rectangular gate shape during an optical proximity correction process so that a resulting gate shape approximates the transistor gate shape.

13. An apparatus that generates a physical layout for a transistor, comprising:

an analysis mechanism configured to determine a transistor gate shape for the transistor based on a transistor library so that a fabricated transistor with the transistor gate shape substantially achieves one or more desired operating characteristics, wherein the transistor library includes a correlation between operating characteristics of fabricated transistors and transistor gate shapes; and a layout-generation mechanism configured to generate the physical layout for the transistor, wherein the physical layout includes the transistor gate shape, and wherein the physical layout is used to fabricate the transistor.

14. The apparatus of claim 13, wherein the layout-generation mechanism is configured to:

select a library element which includes the transistor gate shape; and generate the physical layout for the transistor based on the library element.

15. The apparatus of claim 14, wherein the layout-generation mechanism is configured to:

select a parameterized library element which includes a transistor gate having a shape that substantially achieves the desired transistor gate shape; and scale the parameterized library element so that the transistor gate in the library element has a shape which is substantially equivalent to the determined transistor gate shape.

16. The apparatus of claim 13, wherein the one or more desired operating characteristics for the transistor include one or more of:

a drive strength of the transistor;
a speed of the transistor;
a leakage current of the transistor;
a uniform threshold voltage across a channel of the transistor; and
a uniform current distribution across a channel of the transistor.

17. The apparatus of claim 13, further comprising a library-generation mechanism, wherein prior to receiving the transistor library, the library-generation mechanism is configured to generate the transistor library.

18. The apparatus of claim 17, wherein the library-generation mechanism is configured to:

generate physical layouts for transistors with a specified set of transistor gate shapes;

fabricate the physical layouts for the transistors;

measure the operating characteristics for the fabricated transistors; and correlate the measured operating characteristics of the fabricated transistors with the specified set of transistor gate shapes.

19. The apparatus of claim 13, wherein the layout-generation mechanism is configured to:

generate a physical layout containing a rectangular gate shape, wherein the rectangular gate shape approximates the one or more desired operating characteristics for the transistor; and process the rectangular gate shape during an optical proximity correction process so that a resulting gate shape approximates the transistor gate shape.

* * * * *